United States Patent
Tsunano et al.

(10) Patent No.: US 11,101,416 B2
(45) Date of Patent: Aug. 24, 2021

(54) METHOD FOR PRODUCING LIGHT EMITTING DEVICE AND SEALING RESIN COMPOSITION FOR LIGHT EMITTING DEVICE

(71) Applicant: NICHIA CORPORATION, Anan (JP)

(72) Inventors: Katsuyuki Tsunano, Tokushima (JP); Daisuke Niki, Tokushima (JP); Masafumi Kuramoto, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 16/724,465

(22) Filed: Dec. 23, 2019

(65) Prior Publication Data

US 2020/0212272 A1  Jul. 2, 2020

(30) Foreign Application Priority Data

Dec. 28, 2018  (JP) .............................. JP2018-248024

(51) Int. Cl.
*H01L 33/54* (2010.01)
*H01L 33/20* (2010.01)
*H01L 33/56* (2010.01)
*H01L 33/50* (2010.01)

(52) U.S. Cl.
CPC .............. *H01L 33/54* (2013.01); *H01L 33/20* (2013.01); *H01L 2933/005* (2013.01); *H01L 2933/0033* (2013.01)

(58) Field of Classification Search
CPC ......... H01L 33/54; H01L 33/56; H01L 33/52; H01L 33/48; H01L 33/20; H01L 2933/005

See application file for complete search history.

(56) References Cited

U.S. PATENT DOCUMENTS

| | | |
|---|---|---|
| 8,373,185 B2 | 2/2013 | Kumei et al. |
| 2010/0155758 A1 | 6/2010 | Kumei et al. |
| 2015/0162509 A1* | 6/2015 | Kuramoto ............. H01L 33/501 257/98 |

(Continued)

FOREIGN PATENT DOCUMENTS

| | | | |
|---|---|---|---|
| JP | 2004091569 A | * | 3/2004 |
| JP | 2010147244 A | | 7/2010 |

(Continued)

*Primary Examiner* — Marcos D. Pizarro
*Assistant Examiner* — Antonio B Crite
(74) *Attorney, Agent, or Firm* — Hunton Andrews Kurth LLP

(57) ABSTRACT

A method for producing a light emitting device, including: integrally molding plural leads with a molded resin portion comprising a resin composition containing a thermosetting resin or a thermoplastic resin, so as to prepare a substrate having a concave portion having a side surface and a bottom surface; disposing a light emitting element on the bottom surface of the concave portion; forming a film including a metal oxide on the side surface of the concave portion and an upper surface of the substrate; disposing a sealing resin composition containing an addition curing silicone resin composition containing an organopolysiloxane containing a functional group capable of performing a crosslinking reaction and an aryl group in one molecule, and an organic modified silicone oil that is unreactive with the organopolysiloxane, in the concave portion; and curing the sealing resin composition to form a resin package.

18 Claims, 5 Drawing Sheets

(56) References Cited

U.S. PATENT DOCUMENTS

2020/0251624 A1* 8/2020 Tangring .............. H01L 33/504

FOREIGN PATENT DOCUMENTS

| JP | 2010174220 A | 8/2010 |
|----|--------------|--------|
| JP | 2015097276 A | 5/2015 |
| JP | 2015115494 A | 6/2015 |
| JP | 2015177183 A | 10/2015 |

* cited by examiner

METHOD FOR PRODUCING LIGHT EMITTING DEVICE AND SEALING RESIN COMPOSITION FOR LIGHT EMITTING DEVICE

CROSS-REFERENCE TO RELATED PATENT APPLICATION

This application claims priority to Japanese Patent Application No. 2018-248024, filed on Dec. 28, 2018, the disclosure of which is hereby incorporated reference in its entirety.

BACKGROUND

Technical Field

The present disclosure relates to a method for producing a light emitting device and a sealing resin composition for a light emitting device.

Description of Related Art

A light emitting device using a light emitting element has been used for various light sources. A light emitting device using a light emitting diode (which may be referred to as LED) or a laser diode (which may be referred to as LD) as a light emitting element is a light source having a high conversion efficiency, and has been used as a light source replacing an incandescent lamp and a fluorescent lamp due to the small electric power consumption, the long lifetime, and the capability of size reduction thereof. In particular, a surface mounted light emitting device has such characteristics as a small size, emission of light with brilliant color, excellent initial driving characteristics, and strength against vibration and repeated turning on and off. The enhancement of the output power of the light emitting device is also rapidly proceeding. The light emitting device using LED or LD has been applied to a wide range of fields including a light emitting device for automobile use or indoor illumination, a backlight source of a liquid crystal display device, a light source device for illuminations or projectors.

In the light emitting device of this type, for example, a light emitting element is disposed on a bottom surface of a substrate having a concave portion, and for protecting the light emitting element, a sealing member is formed by disposing a sealing resin composition for covering the light emitting element in the concave portion of the substrate. As the output power of the light emitting element increases, a resin composition containing a silicone resin has also come to be used as a sealing resin composition. For example, Japanese Unexamined Patent Publication No. 2015-097276 describes a light emitting device using a sealing resin composition containing an addition curing silicone resin composition containing a silicone resin having a carbon-carbon double bond group and a silicone resin having a hydrosilyl group.

SUMMARY

However, in the light emitting device of this type, in the case where a polar group, such as an amide group, an ester group, an epoxy group, or a hydroxy group, exists on the surface of the substrate, the wettability between the sealing resin composition and the surface of the substrate is enhanced, which results in the possibility that the sealing resin composition does not remain in the concave portion, but the sealing resin composition causes unintended wetting and spreading to the upper surface of the concave portion of the substrate. In the case where the sealing resin composition causes the wetting and spreading to the unintended portion, the sealing resin composition wetting and spreading may remain burrs, which may results in problems including scattering of the burrs in the subsequent process steps.

Under the circumstances, an object of one embodiment of the present disclosure is to provide a method for producing a light emitting device that is capable of suppressing unintended wetting and spreading of a sealing resin composition, and a sealing resin composition.

A first embodiment of the present disclosure relates to a method for producing a light emitting device, including:

integrally molding plural leads with a molded resin portion comprising a resin composition containing a thermosetting resin or a thermoplastic resin, so as to prepare a substrate having a concave portion having a side surface and a bottom surface;

disposing a light emitting element on the bottom surface of the concave portion;

forming a film comprising a metal oxide on the side surface of the concave portion and an upper surface of the substrate;

disposing a sealing resin composition containing an addition curing silicone resin composition containing an organopolysiloxane containing a functional group capable of performing a crosslinking reaction and an aryl group in one molecule, and an organic modified silicone oil that is unreactive with the organopolysiloxane contained in the addition curing silicone resin composition, in the concave portion; and curing the sealing resin composition to form a resin package.

A second embodiment of the present disclosure relates to a sealing resin composition for a light emitting device for sealing a light emitting element disposed on a substrate, the sealing resin composition containing an addition curing silicone resin composition containing an organopolysiloxane containing a functional group capable of performing a crosslinking reaction and an aryl group in one molecule, and an organic modified silicone oil that is unreactive with the organopolysiloxane contained in the addition curing silicone resin composition.

According to one embodiment of the present disclosure, a method for producing a light emitting device that is capable of suppressing unintended wetting and spreading of a sealing resin composition, and a sealing resin composition can be provided.

DETAILED DESCRIPTION

The method for producing a light emitting device and the sealing resin composition for a light emitting device according to the present disclosure will be described with reference to embodiments below. However, the embodiments shown below are examples for substantiating the technical concept of the present invention, and the present invention is not limited to the method for producing a light emitting device and the sealing resin composition for a light emitting device shown below. The relationships between the color names and the color coordinates, the relationships between the wavelength ranges of light and the color names of monochromatic light are in accordance with JIS Z8110. In the case where plural substances corresponding to one component are present in a composition, the content of the component in the composition means the total amount of the plural substances present in the composition unless otherwise indicated.

Figure 5:
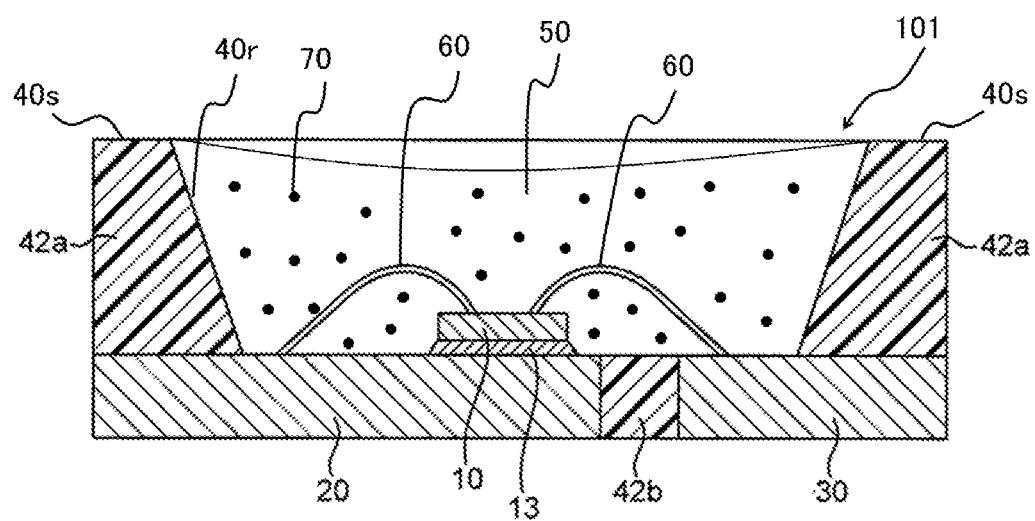
FIG. 5 is a schematic cross sectional view showing an example of a light emitting device.

An example of the method for producing a light emitting device according to an embodiment of the present disclosure will be described. FIG. 5 is a schematic cross sectional view showing a light emitting device 101 produced by a method according to an embodiment of the present disclosure. The method for producing a light emitting device may include a substrate preparing step, a light emitting element disposing step, a film forming step, a sealing resin disposing step; and a resin package forming step. In the case where an aggregate substrate having plural concave portions is used in the method for producing a light emitting device, the method may further include dividing the aggregate substrate into resin packages of each of unit regions, after the resin package forming step.

Substrate Preparing Step

In the substrate preparing step, plural leads are integrally molded with a molded resin portion comprising a resin composition containing a thermosetting resin or a thermoplastic resin, so as to prepare a substrate having a concave portion having a side surface and a bottom surface.

Figure 1:
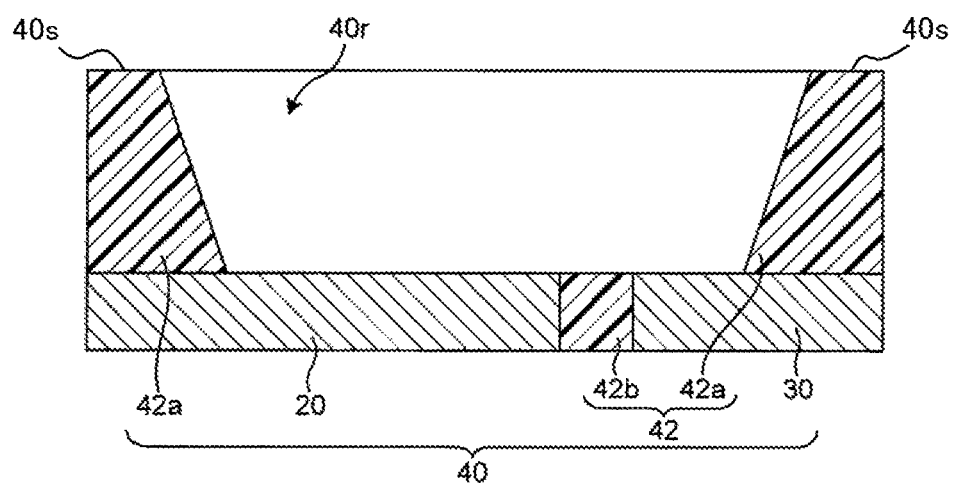
FIG. 1 is a schematic cross sectional view showing an example of a substrate of a light emitting device in one unit region.

FIG. 1 is a schematic cross sectional view showing an example of a substrate 40 in one unit region. The substrate 40 has a first lead 20 and a second lead 30, which are integrally molded with a molded resin portion 42 containing a thermosetting resin or a thermoplastic resin. For example, a lead frame including the first lead 20 and the second lead 30 divided from each other is prepared, the first lead 20 and the second lead 30 are supported at prescribed positions in a cavity of a resin molding die, and a molding resin is charged into the cavity and then cured. Examples of the method of charging the molding resin into the cavity include an injection molding method and a transfer molding method. The molded resin portion 42 includes a first molded resin portion 42a that is molded to form a concave portion 40r above the first lead 20 and the second lead 30, and a second molded resin portion 42b that supports the first lead 20 and the second lead 30, which are separated and insulated from each other. The first lead 20, the second lead 30, and the molded resin portion 42 are integrally molded in this manner, so as to prepare the substrate 40 having the concave portion 40r having a side surface and a bottom surface, and an upper surface 40s.

Figure 2:
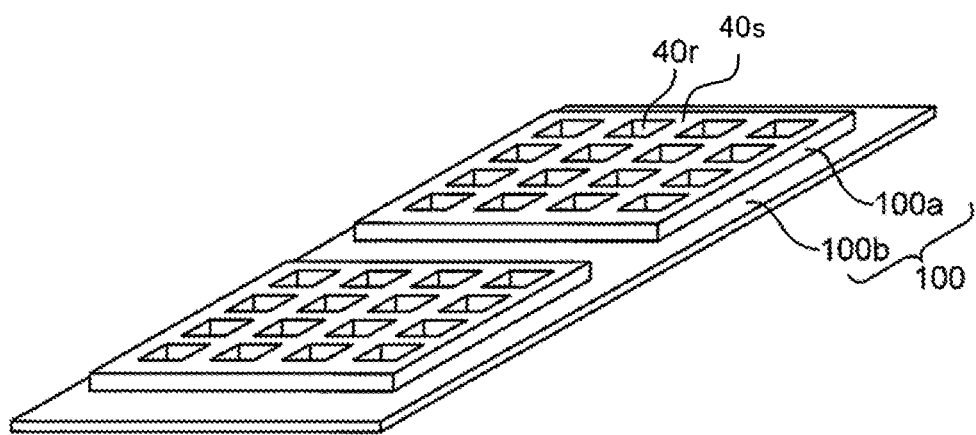
FIG. 2 is a perspective view showing an example of an aggregate substrate having plural concave portions.

FIG. 2 is a perspective view showing an example of an aggregate substrate 100 having plural concave portions 40r. The substrate may be an aggregate substrate 100 having plural concave portions 40r shown in FIG. 2. The aggregate substrate 100 includes a molded resin portion 100a that has plural concave portions 40r integrally molded, and a lead frame 100b that has a first lead 20 and a second lead 30 divided from each other. The upper surface 40s of the aggregate substrate 100 is formed between the concave portion 40r and the concave portion 40r. The resin molded portion 100a of the aggregate substrate 100 has resin molded resin portions 42 of each of the unit regions integrally molded.

Figure 3:
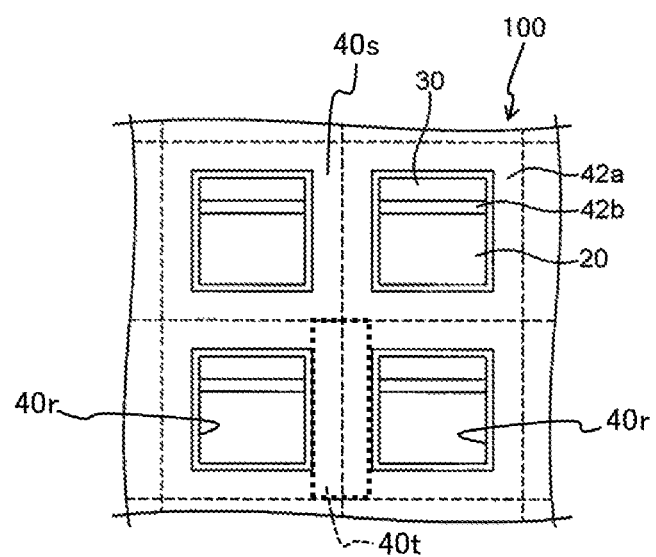
FIG. 3 is a top view showing a part of an aggregate substrate.

FIG. 3 is a top view showing a part of the aggregate substrate 100. One unit region of the aggregate substrate 100 includes the first lead 20, the second lead 30, a first molded resin portion 42a that is molded to form at least one concave portion 40r, a second molded resin portion 42b that supports the first lead 20 and the second lead 30, which are separated and insulated from each other, and the upper surface 40s. It is possible that a through hole is formed in the first lead 20 in contact with the first molded resin portion 42a and the second lead 30, and the molding resin for forming the first molded resin portion 42a is made to penetrate through the through hole, so as to support the first lead 20 and the second lead 30 firmly with the first molded resin portion 42a. In FIG. 3, the symbol 40t shows an example of a test region for performing a resin leakage test.

The substrate may be produced by using a resin molding die as described above, or in alternative, a substrate having a first lead 20 and a second lead 30 having been integrally molded with a molded resin portion 42 in advance may be purchased and used.

Light Emitting Element Disposing Step

Figure 4:
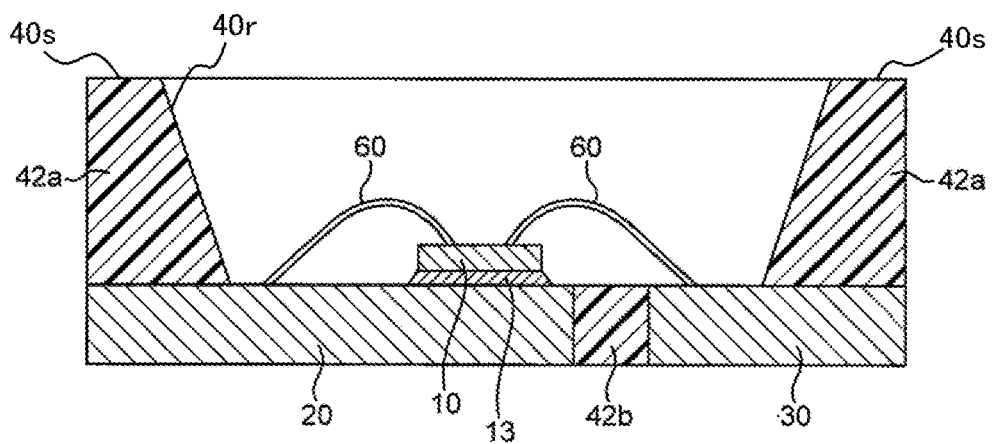
FIG. 4 is a schematic cross sectional view showing an example of a light emitting element disposed on a concave portion of a substrate.

In the disposing step, a light emitting element 10 is disposed on the bottom surface of the concave portion 40r. FIG. 4 is a schematic cross sectional view showing an example of a light emitting element 10 disposed on a substrate 40 having one concave portion 40r and an upper surface 40s. The light emitting element 10 has positive and negative electrodes on the light emitting surface thereof, and is die-bonded to the upper surface of the first lead 20 exposed on the bottom surface of the concave portion 40r, and the positive and negative electrodes are connected to the first lead 20 and the second lead 30 respectively with wires 60. In the case of the aggregate substrate 100 having plural concave portions 40r, the light emitting element 10 is die-bonded to the upper surface of the first lead 20 exposed on the bottom surface of the concave portion 40r in each of the unit regions. Examples of a bonding member 13 used for die-bonding the light emitting element 10 include bonding members 13 containing a silicone resin and an epoxy resin.

Film Forming Step

In the film forming step, a film comprising or composed of a metal oxide is formed on the side surface of the concave portion 40r and the upper surface 40s of the substrate 40. The film comprising or composed of a metal oxide is formed on the side surface of the concave portion 40r and the upper surface 40s of the substrate 40, and also may be formed on the exposed surfaces of the first lead 20 and the second lead 30 exposed on the bottom surface of the concave portion 40r, the upper surface and/or the side surface of the light emitting element 10, and the surface of the wires 60. The film comprising or composed of a metal oxide formed on the side surface of the concave portion 40r of the substrate 40 and the upper surface 40s of the substrate 40 protects the side surface of the concave portion 40r of the substrate 40 and the upper surface 40s of the substrate 40. In the case where the film comprising or composed of a metal oxide is formed on the exposed surfaces of the first lead 20 and the second lead 30, the upper surface and/or the side surface of the light emitting element 10, and the surface of the wires 60, the metal oxide film protects the portions having the film formed thereon. Examples of the metal oxide used for the metal oxide film include $SiO_2$, $TiO_2$, and $Al_2O_3$. The metal oxide film may be formed in such a method as a sputtering method, a CVD (chemical vapor deposition) method, an ALD (atomic layer deposition) method.

Sealing Resin Composition Disposing Step

In the disposing step of a sealing resin composition, a sealing resin composition is disposed in the concave portion 40r. The sealing resin composition may be disposed in the concave portion 40r, for example, by an injection molding method, a potting molding method, a printing method, a transfer molding method, or a compression molding method.

The sealing resin composition may contain an addition curing silicone resin composition containing an organopolysiloxane containing a functional group capable of performing a crosslinking reaction and an aryl group in one molecule, and an organic modified silicone oil that is unreactive with the organopolysiloxane contained in the addition curing silicone resin composition. The organic modified silicone oil contained in the sealing resin composition can suppress the unintended wetting and spreading of the sealing resin composition from the concave portion 40r to the upper surface 40s of the substrate 40. In the case where the film comprising or composed of a metal oxide is formed on the side surface of the concave portion 40r of the substrate 40 and the upper surface 40s of the substrate 40, a hydroxy group may exist on the surface of the film comprising or composed of a metal oxide, and since the hydroxy group and a silanol group formed through hydrolysis of the organopolysiloxane tend to undergo dehydration condensation, the sealing resin composition tends not to stay behind the edge of the concave portion 40r of the substrate 40, but the unintended wetting and spreading thereof to the upper surface 40s of the substrate 40 tends to occur.

In general, a silicone oil has a surface tension that is smaller than a surface tension of a mineral oil and a surface tension of water, and tends to cause more wetting and spreading than ordinary oils and solvents, such as a mineral oil.

However, in the case where the sealing resin composition contains the addition curing silicone resin composition containing an organopolysiloxane containing a functional group capable of performing a crosslinking reaction and an aryl group in one molecule, and the organic modified silicone oil that is unreactive with the organopolysiloxane contained in the addition curing silicone resin composition, the sealing resin composition disposed in the concave portion 40r of the substrate 40 can be made to stay behind the edge of the concave portion 40r, and the wetting and spreading thereof to the upper surface 40s of the substrate 40 can be suppressed. It is estimated that the organic modified silicone oil contained in the sealing resin composition increases the surface tension of the sealing resin composition through the influence of the organic group introduced to the organic modified silicone oil, so as to form a meniscus edge at the edge of the concave portion 40r, and the wetting and spreading of the sealing resin composition is suppressed thereby.

Resin Package Forming Step

In the resin package forming step, the sealing resin composition disposed in the concave portion 40r of the substrate 40 is cured to form a fluorescent member 50, and thus a resin package is formed. The method of curing the addition curing silicone resin composition contained in the sealing resin composition is preferably a curing method that conforms to the organopolysiloxane contained in the addition curing silicone resin composition, and for example, the sealing resin composition may be cured by ordinary temperature curing, heat curing, or photocuring with an ultraviolet ray. The sealing resin composition may contain a fluorescent material 70 that converts the wavelength of light emitted from the light emitting element 10, in addition to the addition curing silicone resin composition and the unreactive organic modified silicone oil, and the fluorescent member 50 preferably contains the fluorescent material 70. The aggregate substrate 100 may form an aggregate resin package, in which the sealing resin composition is disposed and cured in the concave portions 40r of each of the unit regions. In this specification, the "fluorescent material" is used in the same meaning as a "fluorescent phosphor".

Dividing Step

In the case where the aggregate substrate 100 is used, in the dividing step, the aggregate substrate 100 having plural concave portions 40r is divided into a plurality of resin packages and each of the plurality of resin packages is in each of the unit regions, so as to provide respective light emitting devices 101. The method used for dividing the aggregate substrate 100 may be cutting with a lead cut die or a dicing saw, cutting with laser light, or the like. In the case where plural resin packages are integrally molded, the aggregate substrate may be divided by cutting the lead and the resin molded portion simultaneously. By suppressing the unintended wetting and spreading of the sealing resin composition, the formation of burrs of the cured sealing resin composition having wetted and spread, for example, to the upper surface 40s between the concave portion 40r and the concave portion 40r can be prevented, and the problems including scattering of the burrs can be avoided even in dividing the aggregate substrate 100.

FIG. 5 is a schematic cross sectional view showing an example of a light emitting device obtained after the resin package forming step or the dividing step. The light emitting device 101 has a first molded resin portion 42a that forms an upper surface 40s and a concave portion 40r, a second molded resin portion 42b, a first lead 20 and a second lead 30 constituting a bottom surface of the concave portion 40r, a light emitting element 10 as a light source, and a fluorescent member 50 that covers the light emitting element 10. The light emitting element 10 is disposed on the first lead 20 and connected to the first lead 20 and the second lead 30 with two wires 60 respectively. The light emitting element 10 is covered with the fluorescent member 50 to constitute a resin package. The fluorescent member 50 may contain a fluorescent material 70 that converts the wavelength of light emitted from the light emitting element 10.

The members constituting the light emitting device will be described.

Lead

The lead includes the first lead 20 and the second lead 30. The material used constituting the lead may be a plate material formed of at least one metal selected from copper, aluminum, gold, silver, tungsten, iron, and nickel, or an alloy, such as an iron-nickel alloy and phosphor bronze, and for extracting light from the light emitting element 10 efficiently, a film formed of a metal, such as silver, aluminum, or gold, or an alloy thereof may be formed on the surface of the lead. The film formed on the first lead 20 and the second lead 30 may be a single layer film or a multilayer film. The film formed on the lead is preferably formed by plating.

Substrate

The resin contained in the resin composition constituting the molded resin portion 42 of the substrate 40 may comprise or be a thermosetting resin or a thermoplastic resin. Specific examples thereof used include an epoxy resin, a modified epoxy resin, a silicone resin, a modified silicone resin, a polyimide resin, a modified polyimide resin, a urethane resin, a modified urethane resin, a bismaleimide-triazine resin, a polyamide resin, polycyclohexylene dimethyl terephthalate, polycyclohexane terephthalate, a liquid crystal polymer, polyethylene terephthalate, polyethylene naphthalate, and combinations thereof. The resin composition constituting the molded resin portion 42 may contain a white pigment having a high light reflectivity for decreasing the transmission of light of the concave portion 40r in the direction toward the side surface thereof and for enhancing the reflection on the internal side surface of the concave portion 40r. The resin composition constituting the molded resin portion 42 may further contain a filler, a diffusing agent, and a reflective substance, in addition to the white pigment. Examples of the materials of the white pigment, the filler, the diffusing agent, and the reflective substance include silicon oxide, titanium oxide, zinc oxide, aluminum oxide, zirconium oxide, calcium oxide, calcium silicate, potassium titanate, and glass particles.

Light Emitting Element

The light emitting element 10 is used as an excitation light source of the light emitting device 101. The light emitting element 10 may have a peak wavelength of 320 nm or more. In the case where the peak wavelength of light emitted from the light emitting element 10 is in the ultraviolet region or the visible region of 320 nm or more, silver contained in the conductive member has a high reflectance thereto, and the extraction efficiency of light of the light emitting device can be enhanced. The peak wavelength of light emitted from the light emitting element 10 is preferably in a range of 320 nm or more and 550 nm or less, more preferably in a range of 350 nm or more and 500 nm or less, further preferably 400 nm or more and 490 nm or less, still further preferably in a range of 420 nm or more and 475 nm or less, and particularly preferably in a range of 450 nm or more and 475 nm or less. The full width at half maximum of the light emission spectrum of the light emitting element 10 may be 30 nm or less, may be 25 nm or less, and may be 20 nm or less. The full width at half maximum means the full width at half maximum (FWHM) of the light emission peak in the light emission spectrum, which means the wavelength width of the light emission peak at 50% of the maximum value of the light emission intensity of the light emission peak in the light emission spectrum. The light emitting element 10 is preferably, for example, a semiconductor light emitting element using a nitride semiconductor ($In_XAl_YGa_{1-X-Y}N$, wherein $0 \leq X$, $0 \leq Y$, and $X+Y \leq 1$). The use of the semiconductor light emitting element as the light emitting element 10 may provide the light emitting device 101 that has high efficiency, high linearity of output with respect to input, and high resistance and stability against mechanical impacts.

Sealing Resin Composition

The sealing resin composition may contain an addition curing silicone resin composition containing an organopolysiloxane containing a functional group capable of performing a crosslinking reaction and an aryl group in one molecule, and an organic modified silicone oil that is unreactive with the organopolysiloxane contained in the addition curing silicone resin composition.

Addition Curing Silicone Resin Composition

The addition curing silicone resin composition preferably contains (A) an organopolysiloxane containing a functional group capable of performing a crosslinking reaction and an aryl group in one molecule, (B) an organohydrogenpolysiloxane containing at least 2 hydrogen atoms each bonded to a silicon atom (i.e., SiH groups) in one molecule, and (C) a hydrosilylation catalyst.

(A) Organopolysiloxane

In the organopolysiloxane as the component (A), the functional group capable of performing a crosslinking reaction may be contained in an amount of at least 2, more preferably in a range of 2 or more and 100 or less, and more preferably in a range of 2 or more and 50 or less, per one molecule. The functional group capable of performing a crosslinking reaction contained in the organopolysiloxane is preferably an aliphatic unsaturated hydrocarbon group bonded to a silicon atom. The aliphatic unsaturated hydrocarbon group is preferably a monovalent hydrocarbon group having a number of carbon atoms of from 2 to 8 having an aliphatic unsaturated bond, and more preferably an alkenyl group. An alkenyl group bonded to Si is preferred. Examples thereof include an alkenyl group, such as a vinyl group, an allyl group, a propenyl group, an isopropenyl group, a butenyl group, a hexenyl group, a cyclohexenyl group, and an octenyl group. A vinyl group is particularly preferred. The aliphatic unsaturated hydrocarbon group may be bonded to either a silicon atom at the end of the molecular chain or a silicon atom in the molecular chain, and may be bonded to both of them.

Examples of the aryl group contained in the organopolysiloxane include a phenyl group, a tolyl group, a xylyl group, and a naphthyl group, and a phenyl group is preferred.

The organic group bonded to a silicon atom and contained in the organopolysiloxane, other than the functional group and the aryl group, is preferably a substituted or unsubstituted monovalent hydrocarbon group having a number of carbon atoms of from 1 to 18, preferably a number of carbon atoms of from 1 to 10, and more preferably a number of carbon atoms of from 1 to 8. Examples thereof include an alkyl group, such as a methyl group, an ethyl group, a propyl group, an isopropyl group, a butyl group, an isobutyl group, a tert-butyl group, a pentyl group, a neopentyl group, a hexyl group, a cyclohexyl group, an octyl group, a nonyl group, and a decyl group; an aralkyl group, such as a benzyl group, a phenylethyl group, and a phenylpropyl group; and groups obtained by replacing a part or the whole of hydrogen atoms of these groups by a cyano group or a halogen atom, such as fluorine, bromine, or chlorine, such as a chloromethyl group, a chloropropyl group, a bromoethyl group, a trifluoropropyl group, and a cyanoethyl group. A methyl group is particularly preferred.

The molecular structure of the organopolysiloxane is not particularly limited. Examples of the molecular structure of the organopolysiloxane include a linear form, a branched form, and a linear form that partially has a branched structure or a cyclic structure. The organopolysiloxane may be used alone or as a combination of two or more kinds thereof.

The organopolysiloxane may be, for example, an organopolysiloxane represented by the following average compositional formula (1):

$$R^1_a(R^2)_b(R^3)_c SiO_{(4-a-b-c)/2} \qquad (1)$$

wherein in the average compositional formula (1), a satisfies $0.3 \leq a \leq 1.0$, preferably $0.4 \leq a \leq 0.8$; b satisfies $0.05 \leq b \leq 1.5$, preferably $0.2 \leq b \leq 0.8$; and c satisfies $0.05 \leq c \leq 0.8$, preferably $0.05 \leq c \leq 0.3$, provided that a, b, and c satisfy $0.5 \leq a+b+c \leq 2.0$, and more preferably $0.5 \leq a+b+c \leq 1.6$.

In the average compositional formula (1), $R^1$ represents an aryl group having a number of carbon atoms of from 6 to 14, preferably a number of carbon atoms of from 6 to 10, and particularly preferably a phenyl group. $R^2$ represents a substituted or unsubstituted monovalent hydrocarbon group having a number of carbon atoms of from 1 to 10, preferably a number of carbon atoms of from 1 to 6, except for an aryl group and an alkenyl group. Examples of the group represented by $R^2$ include an alkyl group, such as a methyl group, an ethyl group, a propyl group, an isopropyl group, a butyl group, an isobutyl group, a tert-butyl group, a pentyl group, a neopentyl group, a hexyl group, an octyl group, a nonyl group, and a decyl group; an aralkyl group, such as a benzyl group, a phenylethyl group, and a phenylpropyl group; and groups obtained by replacing a part of or the whole of hydrogen atoms of these groups by a cyano group or a halogen atom, such as fluorine, bromine, or chlorine, such as a halogen-substituted alkyl group, e.g., a chloromethyl group, a chloropropyl group, a bromoethyl group, and a trifluoropropyl group, and a cyanoethyl group, and a methyl group is preferred.

In the average compositional formula (1), $R^3$ represents an alkenyl group having a number of carbon atoms of from 2 to 8, preferably a number of carbon atoms of from 2 to 6. Examples of the group represented by $R^3$ include a vinyl group, an allyl group, a propenyl group, an isopropenyl group, a butenyl group, a hexenyl group, a cyclohexenyl group, and an octenyl group, and among these, a vinyl group and an allyl group are preferred.

Examples of the organopolysiloxane include a linear silicone oil and/or a silicone resin having a branched structure. The linear silicone oil contained in the organopolysiloxane contains a functional group capable of performing a crosslinking reaction, preferably an aliphatic unsaturated hydrocarbon group bonded to a silicon atom, in one molecule, and is different from the organic modified silicone oil that is unreactive with the organopolysiloxane contained in the addition-reactive silicone resin composition described later.

The silicone oil is generally an organopolysiloxane having a linear structure having a main chain formed of repetition of a diorganosiloxane unit (($R^4$)$_2$SiO$_{2/2}$ unit) and both ends of the molecular chain blocked with a triorganosiloxy group (($R^4$)$_3$SiO$_{1/2}$ unit) (in the formulae, $R^4$ represents $R^1$, $R^2$, or $R^3$ described above).

The silicone resin as the organopolysiloxane as the component (A) has a branched structure represented by an SiO$_2$ unit (Q unit) and/or an $R^4$SiO$_{1.5}$ unit (T unit). The silicone resin preferably has an aryl group content in the substituents bonded to silicon atoms (except for the oxygen atom forming the siloxane bond) of 5% by mol or more, more preferably in a range of 10% by mol or more and 80% by mol or less, and particularly preferably in a range of 20% by mol or more and 70% by mol or less. Specific examples thereof include a silicone resin formed of an SiO$_2$ unit and an $R^4{}_3$SiO$_{0.5}$ unit (M unit), a silicone resin formed of an $R^4$SiO$_{1.5}$ unit, a silicone resin formed of an $R^4$SiO$_{1.5}$ unit and an $R^4{}_2$SiO unit (D unit), and a silicone resin formed of an $R^4$SiO$_{1.5}$ unit, an $R^4{}_2$SiO unit, and an $R^4{}_3$SiO$_{1.5}$ unit.

The organopolysiloxane preferably has a weight average molecular weight in a range of 500 or more and 100,000 or less in terms of polystyrene conversion by gel permeation chromatography (GPC). The organopolysiloxane having a resin structure may be obtained through single hydrolysis or co-hydrolysis of the corresponding silane or siloxane having a hydrolyzable group by a known method.

As the organopolysiloxane as the component (A), a silicone resin and a silicone oil are preferably used in combination. The combination use thereof may further improve the characteristics as a sealing material, such as the hardness, the elasticity, and the cracking resistance, and simultaneously may improve the surface tack property. The mixing ratio of the silicone resin and the silicone oil (silicone resin/silicone oil) by mass is preferably between 95:5 and 30:70, more preferably between 90:10 and 40:60, and particularly preferably between 90:10 and 50:50.

(B) Organohydrogenpolysiloxane

The addition curing silicone resin composition preferably contains the organohydrogenpolysiloxane as the component (B) that contains hydrogen atoms each bonded to a silicon atom (i.e., SiH groups) in an amount of at least 2, preferably 3 or more, more preferably in a range of 3 or more and 200 or less, further preferably in a range of 3 or more and 100 or less, and still further preferably in a range of 3 or more and 20 or less, per one molecule. It suffices that the organohydrogenpolysiloxane as the component (B) can form a crosslinked structure through addition reaction of the SiH group in the molecule with the aliphatic unsaturated hydrocarbon group as the functional group contained in the component (A) in the presence of a hydrosilylation catalyst.

Examples of the organic group bonded to a silicon atom of the organohydrogenpolysiloxane include a monovalent hydrocarbon group except for an aliphatic unsaturated hydrocarbon group. In particular, the organic group is preferably an unsubstituted or substituted monovalent hydrocarbon group having a number of carbon atoms of from 1 to 12, more preferably a number of carbon atoms of from 1 to 10. Examples thereof include an alkyl group, such as a methyl group, an ethyl group, a propyl group, a butyl group, a hexyl group, and a dodecyl group, an aryl group, such as a phenyl group, an aralkyl group, such as a 2-phenylethyl group and a 2-phenylpropyl group, groups obtained by replacing a part or the whole of hydrogen atoms of these groups by a cyano group or a halogen atom, such as fluorine, bromine, or chlorine, such as a chloromethyl group, a chloropropyl group, a bromoethyl group, a trifluoropropyl group, and a cyanoethyl group, and an epoxy ring-containing organic group (i.e., a glycidyl group-substituted or glycidyloxy group-substituted alkyl group), such as 2-glycidoxyethyl group, a 3-glycidoxypropyl group, and a 4-glycidoxybutyl group. The organic group bonded to a silicon atom of the organohydrogenpolysiloxane preferably contains an aryl group.

The organohydrogenpolysiloxane is not particularly limited in molecular structure. Examples of the molecular structure of the organohydrogenpolysiloxane include a linear form, a branched form, a cyclic form, and a linear form that partially has a branched structure or a cyclic structure.

The amount of the organohydrogenpolysiloxane as the component (B) mixed may be an amount that provides a number of SiH groups in the component (B) in a range of 0.5 or more and 5 or less, preferably in a range of 0.8 or more and 3 or less, and more preferably in a range of 1 or more and 2.5 or less, based on the number of the functional group capable of performing a crosslinking reaction, and preferably the number of the aliphatic unsaturated hydrocarbon group, in the component (A). In the case where the SiH groups of the component (B) are contained in an amount in the aforementioned range based on the functional group capable of performing a crosslinking reaction in the component (A), the addition reaction can proceed without the unevenness in crosslinked structure and the deterioration in storage stability of the composition, and the crosslinking can be sufficiently performed.

The organohydrogenpolysiloxane as the component (B) preferably represented by the following average compositional formula (2) containing at least 2 (generally in a range of 2 or more and 300 or less), preferably containing 3 or more (for example, in a range of 3 or more and 200 or less), hydrogen atoms each bonded to a silicon atom (i.e., SiH groups) per one molecule:

$$H_e(R)_f SiO_{(4-e-f)/2} \qquad (2)$$

wherein in the average compositional formula (2), R represents monovalent hydrocarbon groups of the same kind or different kinds that contain no aliphatic unsaturated bond; and e and f satisfy $0.001 \leq e < 2$, $0.7 \leq f \leq 2$, and $0.8 \leq e+f \leq 3$.

In the average compositional formula (2), R preferably represents monovalent hydrocarbon groups of the same kind or different kinds that contain no aliphatic unsaturated bond, having a number of carbon atoms of from 1 to 10, preferably from 1 to 7, and examples thereof include the examples for the substituent $R^2$ in the average compositional formula (1), for example, a lower alkyl group, such as a methyl group, and an aryl group, such as a phenyl group.

e and f represent numbers satisfying $0.001 \leq e < 2$, $0.7 \leq f \leq 2$, and $0.8 \leq e+f \leq 3$, and preferably numbers satisfying $0.05 \leq e < 1$, $0.8 \leq f \leq 2$, and $1 \leq e+f \leq 2.7$. The positions of the hydrogen atoms each bonded to a silicon atom are not particularly limited, and may be either the end or the other positions than the end of the molecule.

Examples of the organohydrogenpolysiloxane include tris(dimethylhydrogensiloxy)methylsilane, tris(dimethylhydrogensiloxy)phenylsilane, 1,1,3,3-tetramethyldisiloxane, 1,3,5,7-tetramethylcyclotetrasiloxane, methylhydrogenpolysiloxane having both ends blocked with trimethylsiloxy groups, a dimethylsiloxane-methylhydrogensiloxane copolymer having both ends blocked with trimethylsiloxy groups, dimethylpolysiloxane having both ends blocked with dimethylhydrogensiloxy groups, a dimethylsiloxane-methylhydrogensiloxane copolymer having both ends blocked with dimethylhydrogensiloxy groups, a methylhydrogensiloxane-diphenylsiloxane copolymer having both ends blocked with trimethylsiloxy groups, a methylhydrogensiloxane-diphenylsiloxane-dimethylsiloxane copolymer having both ends blocked with trimethylsiloxy groups, a copolymer containing a $(CH_3)_2HSiO_{1/2}$ unit and an $SiO_{4/2}$ unit, and a copolymer containing a $(CH_3)_2HSiO_{1/2}$ unit, an $SiO_{4/2}$ unit, and a $(C_6H_5)SiO_{3/2}$ unit.

In the organohydrogenpolysiloxane as the component (B), the substituents that each are directly bonded to a silicon atom (except for oxygen forming the siloxane bond) preferably contains an aryl group, particularly a phenyl group, in an amount in a range of 5% by mol or more and 70% by mol or less. The addition curing silicone resin composition of this type may have higher transparency and may be further suitable for a photosemiconductor device.

(C) Hydrosilylation Catalyst

The addition curing silicone resin composition preferably contains a hydrosilylation catalyst as the component (C). The hydrosilylation catalyst includes platinum catalysts, palladium catalysts, rhodium catalysts, and the like, and examples thereof include platinum catalysts, such as platinum, platinum black, or chloroplatinic acid, e.g., $H_2PtCl_6 \cdot mH_2O$, $K_2PtCl_6$, $KHPtCl_6 \cdot mH_2O$, $K_2PtCl_4$, $K_2PtCl_4 \cdot mH_2O$, $PtO_2 \cdot mH_2O$ (wherein m represents 0 or a positive integer, and m preferably represents an integer of 0 or more and 6 or less, more preferably 0 or 6), and complexes of these catalysts with a hydrocarbon, such as an olefin, an alcohol, or a vinyl group-containing organopolysiloxane, which may be used alone or as a combination of two or more kinds thereof.

The amount of the catalyst component as the component (C) mixed may be an amount that is effective for curing, i.e., a so-called a catalytic amount. The amount of the catalyst component as the component (C) mixed is generally in a range of 0.1 ppm or more and 1,000 ppm or more, and particularly in a range of 0.5 ppm or more and 200 ppm or less, in terms of the platinum group metal based on 100 parts by mass of the total amount of the component (A).

The addition curing silicone resin composition contained in the sealing resin composition is preferably one that is capable of providing a cured product having a refractive index in a range of 1.47 or more and 1.55 or less, and more preferably one that is capable of providing a cured product having a refractive index in a range of 1.50 or more and 1.53 or less. The refractive index of the cured product obtained by curing the addition curing silicone resin composition is influenced by the organic group bonded to a silicon atom constituting the main chain of the organopolysiloxane. The refractive index may be increased in the case where the organic group is an aryl group, particularly a phenyl group, and the content of the phenyl group is increased. The addition curing silicone resin composition contained in the sealing resin composition that is capable of providing a cured product having a refractive index in a range of 1.47 or more and 1.55 or less may be excellent in transparency and can be favorably used as the sealing resin composition for sealing a light emitting element of a light emitting device. The refractive index of the cured product obtained by curing the addition curing silicone resin composition may be measured according to JIS K7142:2008 generally by using an Abbe refractometer with a sodium D line having a wavelength of 589 nm at 25° C. In the case where the addition curing silicone resin is a commercially available product, the catalogue value thereof may be used.

Organic Modified Silicone Oil

The sealing resin composition contains the addition curing silicone resin composition and an organic modified silicone oil that is unreactive with the organopolysiloxane contained in the addition curing silicone resin composition. Since the sealing resin composition contains the addition curing silicone resin composition and an organic modified silicone oil that is unreactive with the organopolysiloxane contained in the addition curing silicone resin composition, the sealing resin composition disposed in the concave portion of the substrate can stay behind the edge of the concave portion and can be suppressed from causing the wetting and spreading to the upper surface of the substrate. For example, in the case where the wetting and spreading of the sealing resin composition to the upper surface of the substrate can be suppressed in an aggregate substrate having plural concave portions, the formation of burrs can be suppressed in dividing the aggregated substrate to resin packages and each of the resin packages is in each of the unit regions in the dividing step after curing the sealing resin composition. The organic modified silicone oil is unreactive with the organopolysiloxane contained in the addition curing silicone resin composition, and thus is not incorporated into the skeleton of the cured product through the dehydration condensation in the curing reaction.

Examples of the organic modified silicone oil include a side chain modified silicone oil, a both ends modified silicone oil, a one end modified silicone oil, and a side chain and both ends modified silicone oil. Examples of the organic group introduced to the organic modified silicone oil that is unreactive with the organopolysiloxane contained in the addition curing silicone resin composition include an amino group, an epoxy group, a hydroxy group, a carboxy group, an acid anhydride group, a mercapto group, a carbinol group, a phenol group, a polyether group, an aralkyl group, a fluoroalkyl group, a long chain alkyl group, a long chain aralkyl group, a higher fatty acid ester group, and a higher fatty acid amide group.

The organic modified silicone oil preferably has a weight average molecular weight in a range of 700 or more and 10,000 or less, more preferably in a range of 800 or more and 8,000 or less, and further preferably in a range of 900 or more and 5,000 or less, in terms of polystyrene conversion weight average molecular weight by gel permeation chromatography (GPC). The organic modified silicone oil having a weight average molecular weight in a range of 700 or more and 10,000 or less may have good compatibility with the addition curing silicone resin composition, and can suppress the wetting and spreading of the sealing resin composition to the upper surface of the substrate, without impairing the transparency thereof.

The amount of the organic modified silicone oil by mass conversion mixed in the sealing resin composition is preferably in a range of 10 ppm or more and 1,000 ppm or less, more preferably in a range of 20 ppm or more and 900 ppm or less, and further preferably in a range of 30 ppm or more and 800 ppm or less, based on 100 parts by mass of the addition curing silicone resin composition. In the case where the amount of the organic modified silicone oil mixed is in a range of 10 ppm or more and 1,000 ppm or less based on 100 parts by mass of the addition curing silicone resin composition, the sealing resin composition disposed in the concave portion 40r of the substrate 40 can stay behind the edge of the concave portion, and can be suppressed from causing the wetting and spreading thereof to the upper surface 40s of the substrate 40. In the case where the amount of the organic modified silicone oil mixed in the sealing resin composition is in a range of 10 ppm or more and 1,000 ppm or less, the organic modified silicone resin can be suppressed from bleeding out to the surface of the sealing resin composition even in the case where the sealing resin composition containing the organic modified silicone oil is stored for a prolonged period of time.

The sealing resin composition may further contain a fluorescent material, in addition to the addition curing resin composition and the organic modified silicone oil that is unreactive with the organopolysiloxane contained in the addition curing silicone resin composition.

Fluorescent Material

The sealing resin composition preferably contains a fluorescent material 70 that absorbs light from the light emitting element 10 and converts the light to light having a different wavelength. Examples of the fluorescent material 70 used include a YAG (yttrium-aluminum-garnet) fluorescent material activated with Ce (cerium), a LAG (lutetium-aluminum-garnet) fluorescent material activated with Ce, a nitrogen-containing calcium aluminosilicate ($CaO-Al_2O_3-SiO_2$) fluorescent material activated with Eu (europium) and/or Cr (chromium), a silicate (($Sr,Ba)_2SiO_4$) fluorescent material activated with Eu, a β-SiAlON fluorescent material, a fluoride ($K_2SiF_6$:Mn) fluorescent material, and a nitride fluorescent material, such as $CaAlSiN_3$:Eu, $(Sr,Ca)AlSiN_3$:Eu, and $(Sr,Ca)_2Si_5N_8$:Eu. In the compositions showing the fluorescent materials, the plural elements delimited by a comma (,) mean that at least one kind of the plural elements is contained in the composition, and a combination of two or more kinds of the plural elements may be contained. In the compositions showing the fluorescent materials, the term before the colon (:) shows the elements constituting the base crystal and the molar ratios thereof, and the term after the colon (:) shows the activation element. The fluorescent material 70 contained in the sealing resin composition may be used alone or as a combination of two or more kinds of the fluorescent materials.

The content of the fluorescent material in the sealing resin composition may vary depending on the kind of the fluorescent material and the target color tone of the emitted light. For example, the content of the fluorescent material in the sealing resin composition may be in a range of 1 part by mass or more and 400 parts by mass or less, may be in a range of 2 parts by mass or more and 300 parts by mass or less, and may be in a range of 5 parts by mass or more and 250 parts by mass or less, based on 100 parts by mass of the addition curing silicone resin composition.

The sealing resin composition may further contain additional components, such as a filler, a light stabilizer, and a colorant, in addition to the addition curing silicone resin composition, the organic modified silicone oil that is unreactive with the organopolysiloxane contained in the addition curing silicone resin composition, and the fluorescent material. Examples of the filler include silicon oxide, barium titanate, titanium oxide, and aluminum oxide. The content of the additional components other than the addition curing silicone resin composition, the organic modified silicone oil, and the fluorescent material in the sealing resin composition is preferably in a range of 0.01 part by mass or more and 100 parts by mass or less based on 100 parts by mass of the addition curing silicone resin composition.

In the package forming step, the sealing resin composition disposed in the concave portion 40r of the substrate 40 is cured to constitute the fluorescent member 50 that covers the light emitting element 10.

EXAMPLES

The present disclosure will be described more specifically with reference to examples below. The present disclosure is not limited to the examples.

Preparation of Sealing Resin Composition for Light Emitting Element

Resin compositions for sealing a light emitting element were prepared. The members used therefor were as follows.

Addition curing silicone resin composition A: containing organopolysiloxane, "OE-6630", manufactured by Dow Corning Toray Co., Ltd., refractive index of cured product: 1.53, specific gravity of cured product: 1.17

Addition curing silicone resin composition B: containing organopolysiloxane, "OE-7850", manufactured by Dow Corning Toray Co., Ltd., refractive index of cured product: 1.50, specific gravity of cured product: 1.1

Silica fine particles A: "KYKLOS LER-11", manufactured by Tatsumori Ltd., particle diameter: 11 μm, specific gravity: 2.2

Silica fine particles B: "Aerosil RX200", manufactured by Nippon Aerosil Co., Ltd., particle diameter: 12 nm, specific gravity: 2.0

Organic modified silicone oil: epoxy-modified organopolysiloxane, manufactured by Shin-Etsu Chemical Co., Ltd., refractive index: 1.44, specific gravity: 1.03

Fluorescent material A: $Y_3Al_5O_{12}$: Ce, manufactured by Nichia Corporation

Example 1

With 100 parts by mass of the addition curing silicone resin composition A, 20 parts by mass of the fluorescent material A, 60 parts by mass of the silica fine particles A, 0.4 part by mass of the silica fine particles B, and 0.0001 part by mass of the organic modified silicone oil were mixed to prepare a sealing resin composition of Example 1 for sealing a light emitting element.

Example 2

A sealing resin composition of Example 2 was prepared in the same manner as in Example 1 except that the addition curing silicone resin composition A was changed to the addition curing silicone resin composition B.

Comparative Example 1

A sealing resin composition of Comparative Example 1 was prepared in the same manner as in Example 1 except that the organic modified silicone oil was not mixed.

Comparative Example 2

A sealing resin composition of Comparative Example 2 was prepared in the same manner as in Example 2 except that the organic modified silicone oil was not mixed.

Resin Leakage Test

The sealing resin compositions of Examples 1 and 2 and Comparative Examples 1 and 2 were subjected to a resin leakage test. Table 1 shows the results of the resin leakage test. Table 2 shows the standard for the resin leakage amount and the scores.

As shown in FIGS. 1 to 5, a light emitting element 10 emitting blue light was disposed on the bottom surface of a resin package having a concave portion 40r (NFSW157J, a product model number, manufactured by Nichia Corporation), and the sealing resin compositions of Examples and Comparative Examples each were potted in the concave portion 40r of the resin package up to the upper surface 40s thereof. Whether or not the sealing resin composition caused leakage to the upper surface 40s of the resin package was visually checked on the plan view. In the test region for checking the resin leakage on the upper surface 40s of the resin package, for example, the evaluation was performed by checking the proportion of the area with resin leakage occurring, based on the area of the test region 40t on the upper surface 40s between the concave portion 40r and the concave portion 40r shown in FIG. 3. The evaluation was performed in such a manner that the upper surface 40s between two of the concave portion 40r and the concave portion 40r of the resin package having the sealing resin potted therein was visually checked, and the proportion of the area with the resin leakage occurring was scored in five stages. Specifically, a resin package with a higher score of 5 has a smaller area where the resin leakage occurs, whereas a resin package with a lower score of 1 has a larger area where the resin leakage occurs. The total number (n) of the resin packages subjected to the checking of the upper surface 40s between two of the concave portion 40r and the concave portion 40r was 18 for each of Examples and Comparative Examples.

TABLE 1

| Score | Example 1 | Comparative Example 1 | Example 2 | Comparative Example 2 |
|---|---|---|---|---|
| 5 | 18 | 4 | 18 | 4 |
| 4 | 0 | 5 | 0 | 4 |
| 3 | 0 | 6 | 0 | 4 |
| 2 | 0 | 2 | 0 | 1 |
| 1 | 0 | 1 | 0 | 5 |
| Total | 18 | 18 | 18 | 18 |

TABLE 2

| Score | Proportion of area with resin leakage occurring (%) |
|---|---|
| 5 | 0 or more and less than 20 |
| 4 | 20 or more and less than 40 |
| 3 | 40 or more and less than 60 |
| 2 | 60 or more and less than 80 |
| 1 | 80 or more and 100 or less |

It was found from the results of the resin leakage test that the resin packages of Examples 1 and 2 had a score of 5 for all the resin packages tested, and the unintended wetting and spreading of the sealing resin composition was suppressed. In Comparative Examples 1 and 2, on the other hand, 14 packages in 18 packages had a score of 1 to 4, and the resin leakage occurred as compared to the resin packages of Examples 1 and 2. It was found from these results that in the case where the organic modified silicone oil unreactive with the organopolysiloxane contained in the addition curing silicone resin composition was contained in the sealing resin composition, the organic modified silicone oil was significantly effective in reducing the resin leakage. The organic modified silicone oil by mass conversion is contained in the sealing resin composition in a slight amount in a range of 10 ppm or more and 1,000 ppm or less based on 100 parts by mass of the addition curing silicone resin composition, and therefore does not influence the light flux of the light emitting device.

The light emitting device produced by the method according to the embodiment of the present disclosure and the light emitting device using the sealing resin composition according to the embodiment of the present disclosure can be favorably applied to a surface mounted light emitting device, and can be applied to a light emitting device for automobile use or indoor illumination, a backlight source of a liquid crystal display device, a light source device for illuminations or projectors.

The invention claimed is:

1. A method for producing a light emitting device, comprising:
   integrally molding a plurality of leads with a molded resin portion comprising a resin composition containing a thermosetting resin or a thermoplastic resin, so as to prepare a substrate having a concave portion having a side surface and a bottom surface;
   disposing a light emitting element on the bottom surface of the concave portion;
   forming a film comprising a metal oxide on the side surface of the concave portion and an upper surface of the substrate;
   disposing a sealing resin composition containing an addition curing silicone resin composition containing an organopolysiloxane containing a functional group capable of performing a crosslinking reaction and an aryl group in one molecule, and an organic modified silicone oil that is unreactive with the organopolysiloxane contained in the addition curing silicone resin composition, in the concave portion; and
   curing the sealing resin composition to form a resin package,
   wherein the addition curing silicone resin composition is capable of providing a cured product having a refractive index in a range of 1.47 or more and 1.55 or less.

2. The method for producing a light emitting device according to claim 1, wherein the substrate is an aggregate substrate having a plurality of concave portions, and the method further comprises dividing the aggregate substrate into a plurality of resin packages each having at least one concave portion, after curing the sealing resin composition.

3. The method for producing a light emitting device according to claim 1, wherein the organic modified silicone oil has a weight average molecular weight in a range of 700 or more and 10,000 or less.

4. The method for producing a light emitting device according to claim 1, wherein the substrate is an aggregate substrate having a plurality of concave portions in the step of preparing the substrate.

5. The method for producing a light emitting device according to claim 1, wherein in disposing the light emitting element, the light emitting element is disposed on the bottom surface of the concave portion using a bonding member containing a silicone resin or an epoxy resin.

6. The method for producing a light emitting device according to claim 1, wherein in forming the film, the metal oxide includes $SiO_2$, $TiO_2$ or $Al_2O_3$.

7. The method for producing a light emitting device according to claim 1, wherein in forming the film, the film comprising a metal oxide is formed in a sputtering method, a CVD (chemical vapor deposition) method, or ALD (atomic layer deposition method).

8. The method for producing a light emitting device according to claim 1, wherein in preparing the substrate, the resin composition constituting the molded resin portion of the substrate contains a white pigment.

9. The method for producing a light emitting device according to claim 1, wherein in disposing the sealing resin composition, the addition curing silicone resin composition further contains an organohydrogenpolysiloxane containing at least 2 hydrogen atoms each bonded to a silicon atom (SiH groups) in one molecule and a hydrosilylation catalyst.

10. The method for producing a light emitting device according to claim 1, wherein in disposing the sealing resin composition, an amount of the organic modified silicone oil mixed is in a range of 10 ppm or more and 1,000 ppm or less based on 100 parts by mass of the addition curing silicone resin composition.

11. The method for producing a light emitting device according to claim 1, wherein in preparing the substrate, the substrate has a first lead and a second lead for the concave portion, at least one of the first lead and the second lead has a through hole and the molded resin composition penetrates the through hole.

12. The method for producing a light emitting device according to claim 11, wherein in disposing the light emitting element, the light emitting element is connected to at least one of the first lead and the second lead with a wire.

13. The method for producing a light emitting device according to claim 12, wherein in forming the film, the film comprising the metal oxide is formed on a upper surface and/or a side surface of the light emitting element, and a surface of the wire.

14. A sealing resin composition for a light emitting device for sealing a light emitting element disposed on a substrate, the sealing resin composition comprising an addition curing silicone resin composition containing an organopolysiloxane containing a functional group capable of performing a crosslinking reaction and an aryl group in one molecule, and an organic modified silicone oil that is unreactive with the organopolysiloxane contained in the addition curing silicone resin composition, wherein the addition curing silicone resin composition is capable of providing a cured product having a refractive index in a range of 1.47 or more and 1.55 or less.

15. The sealing resin composition for a light emitting device according to claim 14, wherein the organic modified silicone oil has a weight average molecular weight in a range of 700 or more and 10,000 or less.

16. The sealing resin composition for a light emitting device according to claim 14, wherein the addition curing silicone resin composition further contains an organohydrogenpolysiloxane containing at least 2 hydrogen atoms each bonded to a silicon atom (SiH groups) in one molecule and a hydrosilylation catalyst.

17. The sealing resin composition for a light emitting device according to claim 14, wherein an amount of the organic modified silicone oil mixed is in a range of 10 ppm or more and 1,000 ppm or less based on 100 parts by mass of the addition curing silicone resin composition.

18. The sealing resin composition for a light emitting device according to claim 14, wherein the organic modified silicone oil includes at least one selected from the group consisting of a side chain modified silicone oil, a both ends modified silicone oil, a one end modified silicone oil, and a side chain and both ends modified silicone oil.

* * * * *